United States Patent
Sakamoto et al.

(10) Patent No.: US 8,558,211 B2
(45) Date of Patent: Oct. 15, 2013

(54) SWITCHING ELEMENT AND METHOD FOR MANUFACTURING SWITCHING ELEMENT

(75) Inventors: Toshitsugu Sakamoto, Tokyo (JP); Noriyuki Iguchi, Tokyo (JP); Naoki Banno, Tokyo (JP); Hisao Kawaura, Tokyo (JP)

(73) Assignee: NEC Corporation, Tokyo (JP)

( * ) Notice: Subject to any disclaimer, the term of this patent is extended or adjusted under 35 U.S.C. 154(b) by 128 days.

(21) Appl. No.: 12/295,282

(22) PCT Filed: Mar. 26, 2007

(86) PCT No.: PCT/JP2007/056192
§ 371 (c)(1),
(2), (4) Date: Sep. 29, 2008

(87) PCT Pub. No.: WO2007/114099
PCT Pub. Date: Oct. 11, 2007

(65) Prior Publication Data
US 2010/0133501 A1 Jun. 3, 2010

(30) Foreign Application Priority Data
Mar. 30, 2006 (JP) .................................. 2006-093513

(51) Int. Cl.
*H01L 47/00* (2006.01)
(52) U.S. Cl.
USPC ................................................. 257/4; 257/2
(58) Field of Classification Search
USPC .......................................................... 257/2, 4
See application file for complete search history.

(56) References Cited

U.S. PATENT DOCUMENTS

| 5,761,115 A | 6/1998 | Kozicki et al. |
| 6,348,365 B1 * | 2/2002 | Moore et al. .................. 438/130 |
| 2002/0054419 A1 * | 5/2002 | Beteille et al. ................ 359/273 |
| 2002/0096681 A1 * | 7/2002 | Yamazaki et al. .............. 257/66 |
| 2004/0229462 A1 * | 11/2004 | Gracias et al. ................ 438/689 |
| 2005/0127524 A1 * | 6/2005 | Sakamoto et al. ............. 257/774 |
| 2006/0164880 A1 | 7/2006 | Sakamoto et al. |
| 2007/0285148 A1 * | 12/2007 | Sakamoto et al. ............ 327/365 |

FOREIGN PATENT DOCUMENTS

| JP | 6-28841 A | 2/1994 |
| JP | 9-36355 A | 2/1997 |
| JP | 2001-525606 A | 12/2001 |
| JP | 2002-536840 A | 10/2002 |
| WO | 03-094227 A1 | 11/2003 |
| WO | 2005/008783 A1 | 1/2005 |
| WO | PCT/JP05/23845 | * 12/2005 |
| WO | 2006070773 A1 | 7/2006 |

OTHER PUBLICATIONS

Japanese Office Action dated Jul. 24, 2012 issued by the Japanese Patent Office in counterpart Japanese Application No. 2008-508531.

(Continued)

*Primary Examiner* — Thao Le
*Assistant Examiner* — Geoffrey Ida
(74) *Attorney, Agent, or Firm* — Sughrue Mion, PLLC

(57) ABSTRACT

A switching element of the present invention utilizes electrochemical reactions to operate, and comprises ion conductive layer 54 capable of conducting metal ions, first electrode 49 arranged in contact with the ion conductive layer, and second electrode 58 for supplying metal ions to the ion conductive layer, wherein an oxygen absorption layer 55 which contains a material more prone to oxidization than the second electrode is formed in contact with the second electrode.

8 Claims, 14 Drawing Sheets

(56) References Cited

OTHER PUBLICATIONS

T. Sakamoto et al., 'A nonvolatile programmable solid electrolyte nanometer switch', Solid-State Circuits Conference, 2004. Digest of Technical Papers. ISSCC. 2004 IEEE International, 2004, p. 290-291.

T. Sakamoto et al., 'Nanometer-scale switches copper sulfide', Applied Physics Letters, 2003, vol. 82, No. 18, p. 3032-3034.

* cited by examiner after heat treatment after heat treatment

SWITCHING ELEMENT AND METHOD FOR MANUFACTURING SWITCHING ELEMENT

TECHNICAL FIELD

The present invention relates to a switching element for use in semiconductor integrated circuits such as a programmable logic, a memory and the like, with the aid of electro-chemical reactions, and a method for manufacturing the switching element.

BACKGROUND ART

A description will be given of the configuration of a conventional switching element which utilizes electro-chemical reactions (hereinafter simply called the "switching element").

FIG. 1 is a schematic cross-sectional view showing an exemplary configuration of a switching element.

As shown in FIG. 1, the switching element comprises first electrode 101, second electrode 102, and ion conductive layer 103. In FIG. 1, ion conductive layer 103 which contains oxygen is sandwiched between first electrode 101 and second electrode 102.

A brief description will be given of the operation of the switching element in the configuration shown in FIG. 1.

As first electrode 101 is grounded and second electrode 102 is applied with a positive voltage, metal ions are supplied from second electrode 102 through an electro-chemical reaction. When the metal ions migrate to first electrode 101 in accordance with an electric field and receives electrons from first electrode 101, a metal is deposited in the ion conductive layer through an electro-chemical reaction. As the deposition continues, first electrode 101 and second electrode 102 are interconnected by the metal, causing the switching element to have a low resistance and thus transition to an ON state. On the other hand, the metal deposited in the ion conductive layer by applying a negative voltage to second electrode 102 transforms into metal ions through a reverse reaction, and the metal ions return to original second electrode 102. In this event, the switching element has a high resistance, and thus transitions to an OFF state. In this way, the switching operation is enabled with electric characteristics between the two electrodes which differ in the ON state and OFF state.

Since the electro-chemical reaction is utilized, second electrode 102 is preferably made of an ionization-prone metal material which can supply metal ions to ion conductive layer 103. Contrary to this, first electrode 101 is preferably made of a metal material which is resistant to ionization.

In this regard, while a two-terminal switching element is shown herein, a three-terminal switching element is disclosed in International Publication WO 2005/008783.

Next, a description will be given of an application of the switching element shown in FIG. 1 to a semiconductor integrated circuit such as a programmable logic, a memory or the like.

FIG. 2 is a schematic cross-sectional view showing an exemplary configuration of a semiconductor integrated circuit which is provided with the switching element. As shown in FIG. 2, the semiconductor integrated circuit comprises transistor layer 122 including transistor devices formed on a main surface of substrate 120, wiring layer 124 for electrically connecting the transistor devices, and passivation film 126 in order. Switching element 110 is arranged in inter-layer dielectric film 132 within wiring layer 124. Also, wiring layer 124 is provided with wiring via 134 for connecting different wires with each other. A gate electrode of transistor layer 122 is connected to wire 130 through a plug, a wiring via and the like.

As shown in FIG. 2, wiring layer 124 provided with switching element 110 is formed with wiring via 134, wire 130, and inter-layer dielectric film 132, and passivation film 126 is formed on inter-layer dielectric film 132. In this way, for incorporating a switching element which utilizes electro-chemical reactions in a semiconductor integrated circuit such as a programmable logic, a memory or the like, a number of processes must be taken into consideration in addition to switching element manufacturing processes.

Semiconductor integrated circuit manufacturing processes are roughly classified into a front end process and a back end process. The former is a process for mainly forming semiconductor devices such as transistors, resistors, capacitors and the like near the surface of a silicon substrate. On the other hand, the latter is a process for forming wires for connecting between transistor devices, passivation films, and the like. In the front end process, thermal treatments are performed at 1000° C. or higher in such processes as formation of oxidized films through thermal oxidization, activation of impurity ions, and the like. On the other hand, in the back end process, thermal treatments are approximately at 350° C. to 400° C. in an inter-layer dielectric film formation, an anneal process and the like.

The switching element which utilizes the electro-chemical reactions cannot endure high-temperature treatments in the front end process because it is provided with metal electrodes as described above. For this reason, it is preferably fabricated in the back end process. Thus, the switching element is formed in the inter-layer dielectric film within wires, as shown in FIG. 2.

DISCLOSURE OF THE INVENTION

As described above, when an attempt is made to incorporate a switching element into a semiconductor integrated circuit, thermal treatments must be performed approximately at 350° C. to 400° C. in the formation of a wiring layer, an inter-layer dielectric film, and a passivation film, an anneal treatment in a final process, and the like after the switching element is formed. A description will be given of the case where the switching element shown in FIG. 1 is thermally treated at 350° C. The second electrode was made of copper, the ion conductive layer is made of tantalum oxide, and the first electrode was made of platinum. A heat treatment was performed at 350° C. for one hour.

The switching element after the heat treatment did not change in resistance even when a voltage was applied thereto. The reason may be thought as follows. When an ambient temperature of the switching element is raised to 300° C. or higher, copper oxide is formed by oxidization of an interface between copper of the second electrode and tantalum oxide of the ion conductive layer, so that the migration of copper ions is prevented by the copper oxide to restrain the supply of copper ions into tantalum oxide. As a result, the resistance does not change, disabling the switching element to serve as a switch. FIG. 3 is a diagram schematically showing this phenomenon. Oxidized layer 105 of the electrode is formed between second electrode 102 and ion conductive layer 103. This oxide layer 105 of the electrode prevents metal ions 104 from migrating from second electrode 102 to ion conductive layer 103.

The present invention has been made to solve the problems inherent to the conventional technologies as described above, and it is an object of the invention to provide a switching element which prevents the formation of an oxidized layer that inhibits the operation, and a method for manufacturing the switching element.

A switching element of the present invention for achieving the above object is a switching element which includes an ion conductive layer capable of conducting a metal ion, a first electrode arranged in contact with the ion conductive layer, and a second electrode for supplying the metal ion to the ion conductive layer, and utilizes an electro-chemical reaction to operate, wherein an oxygen absorption layer including a material more prone to oxidization than the second electrode is arranged in contact with the second electrode.

Also, a switching element of the present invention is a switching element which includes an ion conductive layer capable of conducting a metal ion, a first electrode arranged in contact with the ion conductive layer, a second electrode which exhibits a change in electric characteristics with the first electrode due to deposition or dissolution of the metal ion, and a third electrode for supplying the metal ion to the ion conductive layer, and utilizes an electro-chemical reaction to operate, wherein an oxygen absorption layer including a material more prone to oxidization than the third electrode is arranged in contact with the third electrode.

On the other hand, a method for manufacturing a switching element of the present invention for achieving the aforementioned object is a method for manufacturing a switching element which includes an ion conductive layer capable of conducting a metal ion, a first electrode arranged in contact with the ion conductive layer, and a second electrode for supplying the metal ion to the ion conductive layer, and utilizes an electro-chemical reaction to operate, the method including: forming the second electrode, forming an oxygen absorption layer including a material more prone to oxidization than the second electrode on one of two surfaces defined by the second electrode, forming the ion conductive layer on one of two surfaces defined by the oxygen absorption layer, not in contact with the second electrode, and forming the first electrode on one of two surfaces defined by the ion conductive layer, not in contact with the ion conductive layer.

Also, a method for manufacturing a switching element of the present invention is a method for manufacturing a switching element which includes an ion conductive layer capable of conducting a metal ion, a first electrode arranged in contact with the ion conductive layer, and a second electrode for supplying the metal ion to the ion conductive layer, and utilizes an electro-chemical reaction to operate, the method including: forming the first electrode, forming the ion conductive layer on one of two surfaces defined by the first electrode, forming the second electrode on one of two surfaces defined by the ion conductive layer, not in contact with the first electrode, and forming an oxygen absorption layer including a material more prone to oxidization than the second electrode on one of two surfaces defined by the second electrode, not in contact with the ion conductive layer.

Further, a method for manufacturing a switching element of the present invention is a method for manufacturing a switching element which includes an ion conductive layer capable of conducting a metal ion, a first electrode arranged in contact with the ion conductive layer, a second electrode which exhibits a change in electric characteristics with the first electrode due to deposition or dissolution of the metal ion, and a third electrode for supplying the metal ion to the ion conductive layer, and utilizes an electro-chemical reaction to operate, the method including: forming the second electrode and the third electrode on the same layer spaced apart by a predetermined distance, forming an oxygen absorption layer including a material more prone to oxidization than the third electrode on one of two surfaces defined by the second electrode and on one of two surfaces defined by the third electrode on the same side as the one of two surfaces of the second electrode, forming the ion conductive layer on one of two surfaces defined by the oxygen absorption layer, not in contact with the second electrode and the third electrode, and forming the first electrode on one of two surfaces defined by the ion conductive layer, not in contact with the oxygen absorption layer.

In the present invention, as a heat treatment is performed, the oxygen absorption layer is oxidized instead of the electrode for supplying metal ions. Accordingly, no oxide layer which would inhibit the migration of the metal ion will not be formed on the surface of the electrode in contact with the ion conductive layer. It is therefore possible to prevent the electrode of the switching element from being oxidized under a high-temperature environment in semiconductor integrated circuit manufacturing processes, so that the switching element can escape from degradation in function as a switch which changes the resistance.

Figure 1:
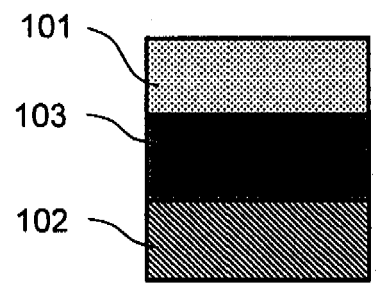
FIG. 1 is a schematic cross-sectional view showing an exemplary configuration of a conventional switching element.

DESCRIPTION OF REFERENCE NUMERALS 10, 31, 49, 101 First Electrodes
12, 32, 58, 65, 74, 102 Second Electrodes
33, 75 Third Electrodes
14, 54, 61, 79, 103 Ion Conductive Layers
16, 18, 20, 55, 63, 78 Oxygen Absorption Layers
40, 70, 120 Substrates
41, 71 First Protection Insulating Films
42, 72 First Inter-layer Dielectric Films
43, 73 First Stop Insulating Films
45, 87 Barrier Metals
46 Copper Wire
47, 76 Second Protection Insulating Films
50, 81 Second Inter-layer Dielectric Films
51, 84 Second Stop Insulating Filnis
52 Second Barrier Insulating Film
53, 85 Connection Holes
57, 64, 82 Third Protection Insulating Films
64, 83 Third Inter-layer Dielectric Films
80 Protection Insulating Film
86 Wiring Groove
62, 88 Copper
89 Fourth Protection Insulating Film
104 Metal Ion
105 Oxidized Film
122 Transistor Layer
124 Wiring Layer
126 Passivation Film
128 Gate Electrode
130 Wire
132 Inter-layer Dielectric Film
134 Wiring Via

BEST MODE FOR CARRYING OUT THE INVENTION

The switching element of the present invention is characterized by an oxygen absorption layer provided for preventing the oxidization of the electrode.

Exemplary Embodiment 1

Figure 4:
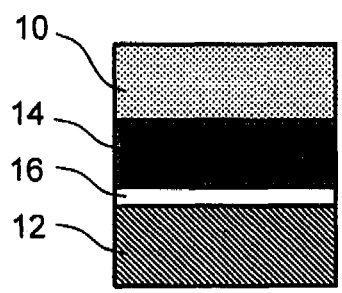
FIG. 4 is a schematic cross-sectional view showing an exemplary configuration of a switching element in Exemplary embodiment 1 of the present invention.

A description will be given of the configuration of a switching element in this exemplary embodiment. FIG. 4 is a schematic cross-sectional view showing an exemplary configuration of the switching element in this exemplary embodiment.

As shown in FIG. 4, the switching element of this exemplary embodiment comprises ion conductive layer 14 and oxygen absorption layer 16 provided between first electrode 10 and second electrode 12. Oxygen absorption layer 16 is sandwiched between ion conductive layer 14 and second electrode 12, where second electrode 12 is in contact with oxygen absorption layer 16. A contact area of second electrode 12 with oxygen absorption layer 16 is equal to the cross-sectional area of the pattern of second electrode 12 in the horizontal direction.

The material of second electrode 12 is a metal which can supply metal ions to ion conductive layer 14 and is prone to ionization. The material of first electrode 10 is a metal which is resistant to ionization. In this exemplary embodiment, the material of first electrode 10 is platinum, while the material of second electrode 12 is copper. The material of ion conductive layer 14 is tantalum oxide. The material of oxygen absorption layer 16 is tantalum or aluminum. Oxygen absorption layer 16 traps oxygen which diffuses into second electrode 12 and binds with the oxygen during a heat treatment to prevent oxidization of second electrode 12. This will be described using a schematic diagram.

Figure 5:
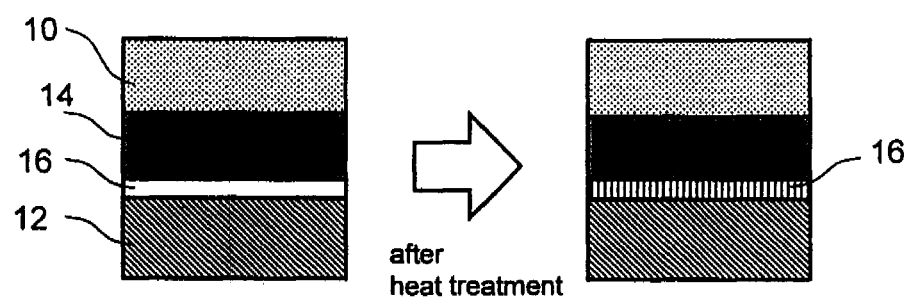
FIG. 5 is a schematic cross-sectional view showing how the switching element shown in FIG. 4 is like before and after a heat treatment.

FIG. 5 is a schematic cross-sectional view showing how the switching element of this exemplary embodiment is like before and after the heat treatment. When the switching element of this exemplary embodiment undergoes the heat treatment, oxygen which conventionally bound with copper of second electrode 16 is trapped by oxygen absorption layer 16. As a result, oxygen absorption layer 16 is oxidized, while second electrode 12 is restrained from the oxidization. Since tantalum and aluminum are more prone to oxidization as compared with copper, the oxidization of copper can be prevented by using these metals for the oxygen absorption layer. In the following, the principles of the present invention will be described in detail.

First of all, a problematic phenomenon was confirmed in the following manner. A metal prone to ionization generally has the nature of proneness to binding with oxygen to result in oxidization. Based on such a nature, the following experiment was made in order to confirm that copper of the second electrode receives oxygen from tantalum oxide of the ion conductive layer through a heat treatment and results in oxidization. A laminate structure was fabricated as an experiment sample, where the second electrode was made of copper, the ion conductive layer made of tantalum oxide, and the first electrode made of platinum. This first experiment sample is comparable to the structure of the conventional switching element. The first experiment sample was thermally treated at 350° C. for one hour. Subsequently, the amount of oxygen contained in each material was measured.

Figure 6:
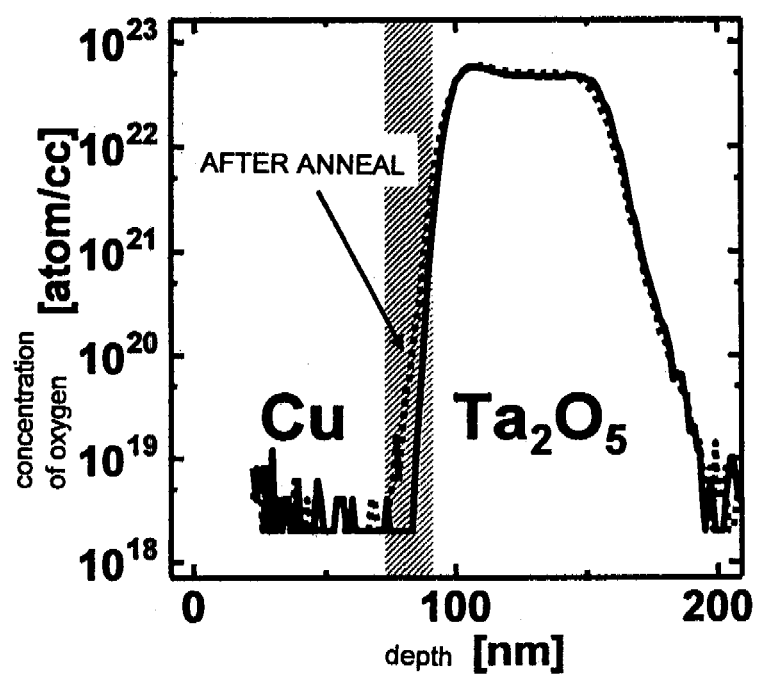
FIG. 6 is a graph showing the result of measuring the amount of oxygen contained in a conventional structure.

FIG. 6 is a graph showing the result of measuring the amount of oxygen contained in each material before and after the heating. The horizontal axis represents the depth of the sample, and the vertical axis represents the concentration of oxygen. A solid line indicates values close to true values, comparable to values before the heating. A broken line indicates measured values after the heating.

The oxygen containing amount in the graph shown in FIG. 6 was measured by shaving the surface of the sample by etching, and measuring flying oxygen elements with a mass spectrometer. Here, problems on actual measurements will be described. Actually measured values in a distribution of oxygen in the depth direction tends to be slow as compared with true values due to the fact that each layer is not uniform in thickness, and elements fly away at a certain depth. For this reason, before heating, the distributions of oxygen on interfaces between copper and tantalum oxide and between platinum and tantalum oxide have a certain degree of slope though they should be essentially abrupt close to vertical on a graph.

Even in consideration of the problem on the actual measurement mentioned above, it can be seen from FIG. 6 that oxygen increases on the copper side after the heating. On the other hand, the oxygen containing amount does not change on the platinum side. This shows that copper is oxidized by oxygen within tantalum oxide.

As the next experiment, a second experiment sample was fabricated in a laminate structure, where the second electrode was made of copper, the ion conductive layer made of tantalum oxide, the first electrode made of platinum, and the oxygen absorption layer made of tantalum. This second experiment sample also underwent a similar heat treatment to the first experiment sample, and oxygen containing amounts were measured. As a result, it was confirmed that the oxygen absorption layer was oxidized by the heat treatment, while the copper of the second electrode was restrained from oxidization.

Figure 7:
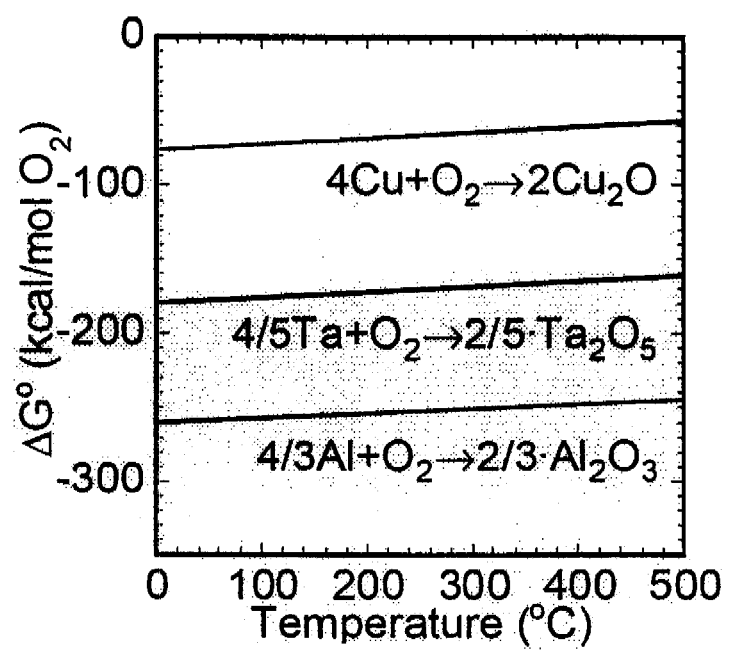
FIG. 7 is a graph showing the proneness of metals to oxidization.

The degree of proneness to oxidization of metal is determined by chemical energy (standard Gibbs free energy) during an oxidization reaction. FIG. 7 shows a graph showing the temperature dependence of the standard Gibbs free energy in oxidization reactions of copper, tantalum, and aluminum. In the graph of FIG. 7, the standard Gibbs free energy is negatively larger in the order of copper, tantalum, and aluminum, showing the proneness to the oxidization. It can be seen from the graph of FIG. 7 that tantalum and aluminum are more prone to oxidization as compared with copper, so that they can be used for the oxygen absorption layer and can prevent copper from oxidization.

By placing either tantalum or aluminum in contact with the second electrode, these metals serve as an oxygen absorption layer. Also, as to tantalum, its degree of proneness to oxidization can be adjusted by partially oxidizing the same. For example, when tantalum is completely oxidized, tantalum peroxide results, but tantalum dioxide is more prone to oxidization as compared with tantalum. When oxygen absorption layer 16 is made of a compound of tantalum and oxygen, oxygen absorption layer 16 may be formed by changing the composition ratio of tantalum to oxygen in correspondence to a target absorption force to oxygen, taking advantage of this nature. In processes which involve many heat treatments after the formation of second electrode 12, tantalum dioxide should be used more than tantalum.

Further, the following advantage results from the use of tantalum for the oxygen absorption layer. Tantalum is oxidized into tantalum oxide which is homogenized with the ion conductive layer, so that they both serve as the ion conductive film. Accordingly, even after heating, the tantalum oxide homogenized with the ion conductive layer does not inhibit the migration of copper ions, and copper ions can be supplied from the second electrode to the ion conductive layer.

Next, a description will be given of a method of manufacturing the switching element of this exemplary embodiment in a semiconductor integrated circuit which incorporates the switching element.

Figure 2:
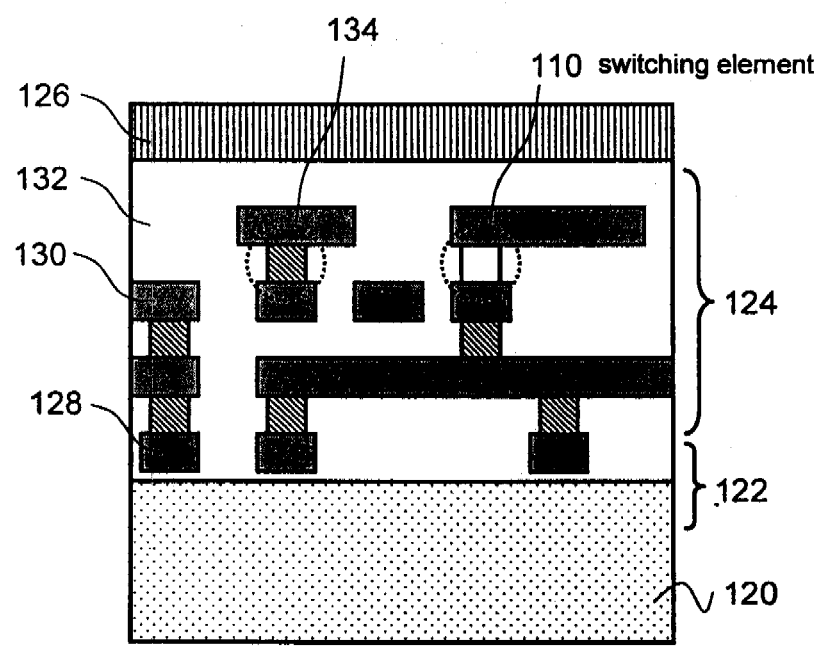
FIG. 2 is a schematic cross-sectional view showing an exemplary configuration of a semiconductor integrated circuit which incorporates the conventional switching element.
Figure 3:
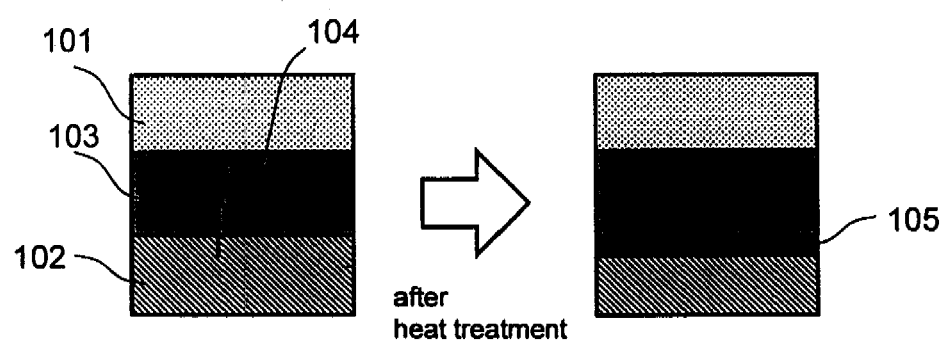
FIG. 3 is a schematic cross-sectional view showing how the conventional switching element is like before and after a heat treatment.

FIGS. 8A to 8H are schematic cross-sectional views for describing the method of manufacturing the switching element. Assume herein that the switching element is formed in a wiring layer of a semiconductor integrated circuit, as shown in FIG. 2.

Figure 8A:
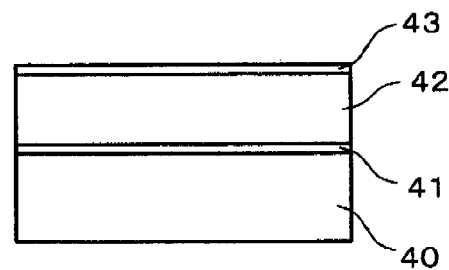
FIG. 8A is a schematic cross-sectional view for describing a method for manufacturing the switching element in Exemplary embodiment 1.

Semiconductor devices including transistors are formed on a semiconductor substrate using conventional technologies, and an insulating film is formed on the semiconductor device, resulting in substrate 40. First protection insulating film 41, first inter-layer dielectric film 42, and first stop insulating film 43 are formed on substrate 40 in order (FIG. 8A).

Figure 8B:
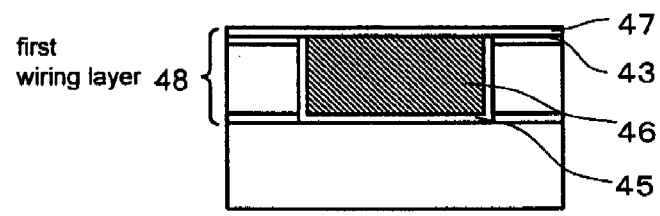
FIG. 8B is a schematic cross-sectional view for describing a method for manufacturing the switching element in Exemplary embodiment 1.

Next, first protection insulating film 41, first inter-layer dielectric film 42, and first stop insulating film 43 are formed with openings for wires of the switching element using the photolithography technology and etching technology. Barrier metal 45 and a copper seed layer which is part of a copper wire are formed in the formed openings by a CVD (chemical vapor deposition) method. In this event, the thickness of the copper seed layer is set to approximately 5 to 50 nm. Then, copper is formed on the copper seed layer by a plating method. The thickness of copper is set to approximately 300 to 800 nm. Subsequently, unnecessary barrier metal 45 and copper, other than those in the openings of first inter-layer dielectric film 42 and first stop insulating film 43 are scraped off by an approach such as a chemical mechanical polishing (CMP, chemical mechanical polishing) method or the like. In this way, copper wire 46 are formed with barrier metal 45 and copper embedded in first protection insulating film 41, first inter-layer dielectric film 42, and first stop insulating film 43. Further, first wiring layer 48 is formed by forming second protection insulating film 47 on copper wire 46 for preventing copper from oxidizing (FIG. 8B).

Figure 8C:
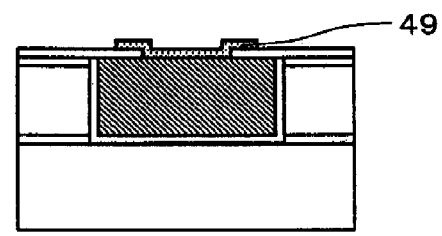
FIG. 8C is a schematic cross-sectional view for describing a method for manufacturing the switching element in Exemplary embodiment 1.

Subsequently, part of second protection insulating film 47 on copper wire 46 is removed by etching. First electrode 49 is formed by deposition of tantalum by a sputtering method and etching (FIG. 8C). The formation of a pattern for first electrode 49 can be performed by a general lithography technology. For example, a photoresist is coated on the surface, and patterning is performed through optical exposure. Using the formed resist pattern as a mask, the first electrode is etched until the top surface of second protection insulating film 47 exposes. Subsequently, the first electrode is formed as shown in FIG. 8C by removing the resist.

Figure 8D:
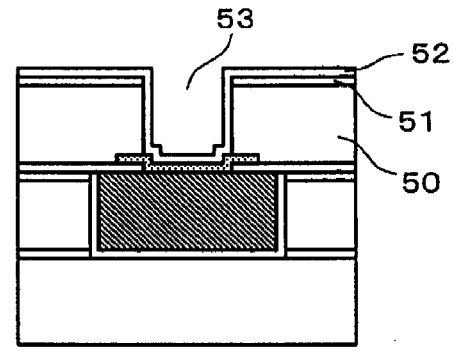
FIG. 8D is a schematic cross-sectional view for describing a method for manufacturing the switching element in Exemplary embodiment 1.

Next, second inter-layer dielectric film 50 and second stop insulating film 51 are formed on first wiring layer 48 in order. Then, as shown in FIG. 8D, a laminate insulating film comprised of second inter-layer dielectric film 50 and second stop insulating film 51 is formed with connection hole 53 in which a switching element is formed by a lithography technology and etching. In the lithography technology in the 90-nm generation, the diameter of connection hole 53 ranges from approximately 80 to 200 nm. Further, barrier insulating film 52 is formed on the bottom and sides of connection hole 53 by a sputtering method.

Figure 8E:
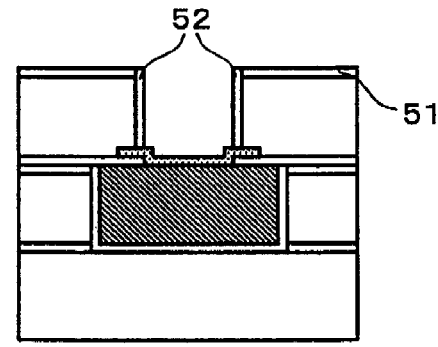
FIG. 8E is a schematic cross-sectional view for describing a method for manufacturing the switching element in Exemplary embodiment 1.

Next, barrier insulating film 52 is removed from the bottom of connection hole 53 by anisotropic etching. In this event, barrier insulating film 52 remains on the sides of connection hole 53 (FIG. 8E).

Figure 8F:
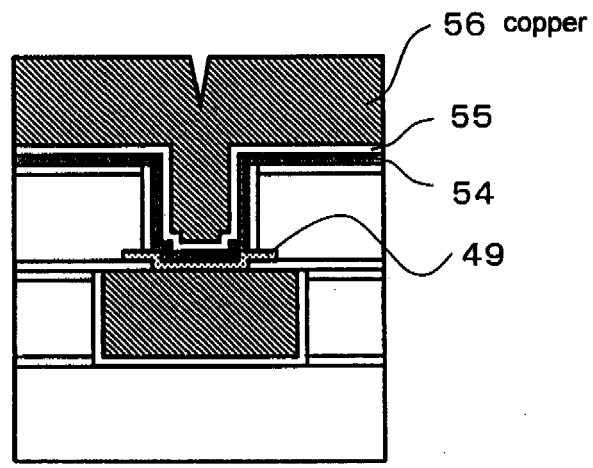
FIG. 8F is a schematic cross-sectional view for describing a method for manufacturing the switching element in Exemplary embodiment 1.

Next, ion conductive layer 54 and oxygen absorption layer 55 are deposited in order on the bottom and sides of connection hole 53 and on second stop insulating film 51 by a sputtering method. Tantalum of 5 nm thick is used for oxygen absorption layer 55, while tantalum oxide of 15 nm thick is used for ion conductive layer 54. Further, an aluminum containing copper seed layer (not shown), which forms part of a wire and a connection via, is formed on oxygen absorption layer 55 by a CVD method. The thickness of the copper seed layer is set to approximately 5 to 50 nm. Further, copper 56 is formed on the copper seed layer by a plating method (FIG. 8F). The thickness of copper is set to approximately 300 to 800 nm.

Subsequently, heating is performed at 350° C. in a nitrogen gas atmosphere. In this anneal process, crystal grains of copper increases, and aluminum contained in the copper seed diffuses into copper 56, playing a role of increasing electro-migration durability. In this heat treatment, oxygen within ion conductive layer 54 diffuses to oxidize oxygen absorption layer 55 (FIG. 8G).

Figure 8G:
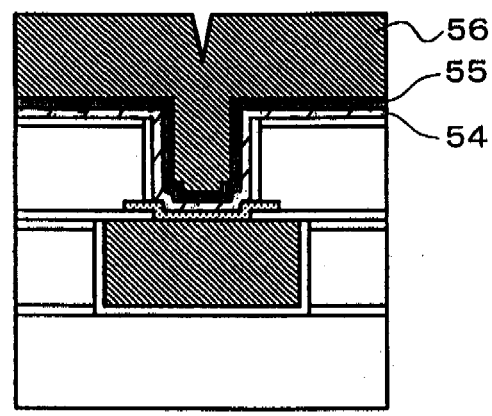
FIG. 8G is a schematic cross-sectional view for describing a method for manufacturing the switching element in Exemplary embodiment 1.
Figure 8H:
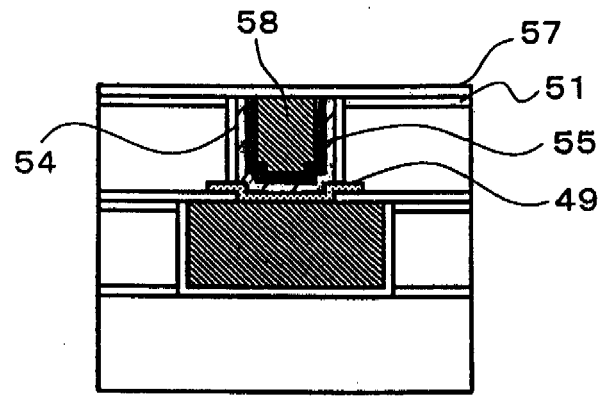
FIG. 8H is a schematic cross-sectional view for describing a method for manufacturing the switching element in Exemplary embodiment 1.

Next, as shown in FIG. 8H, unnecessary oxygen absorption layer 55, ion conductive layer 54, and copper 56 on second stop insulating film 51, other than connection hole 53, are scraped off by an approach such as a CMP method, followed by formation of third protection insulating film 57 on second stop insulating film 51. Since a wiring process subsequent thereto is similar to the conventional art, a description thereon is omitted.

A description will be given of the correspondence of components of the switching element shown in FIG. 4 to the layers shown in FIGS. 8A to 8H. Second electrode 58 shown in FIG. 8H corresponds to second electrode 12 in FIG. 4. Then, first electrode 49 shown in FIGS. 8C to 8H corresponds to first electrode 10 in FIG. 4.

By the heat treatment required in each process from the process described in FIG. 8G to the full completion of the semiconductor integrated circuit manufacturing processes, oxygen within ion conductive layer 54 and inter-layer dielectric film diffuses into tantalum in oxygen absorption layer 55, so that tantalum is oxidized. As tantalum in oxygen absorption layer 55 is oxidized, it is homogenized with tantalum oxide of ion conductive layer 54, and functions as an ion conductive layer of the switching element, as shown in FIG. 8H. On the other hand, when tantalum is used as the first electrode, even part thereof oxidized would be homogenized with the ion conductive layer.

Also, in the manufacturing method described above, when oxygen absorption layer 55 is formed, oxygen absorption layer 55 is preferably formed in such a thickness that not only homogenizes oxygen absorption layer 55 with ion conductive layer 54, in correspondence to the amount of oxygen which diffuses from ion conductive layer 54 and inter-layer dielectric layer through the heat treatment process in FIG. 8G onward, but also prevents first electrode 49 and second electrode 58 from oxidization.

Exemplary Embodiment 2

A switching element of this exemplary embodiment comprises the oxygen absorption layer in an insular pattern in Exemplary embodiment 1. In the following, the configuration of this exemplary embodiment will be described.

Figure 9:
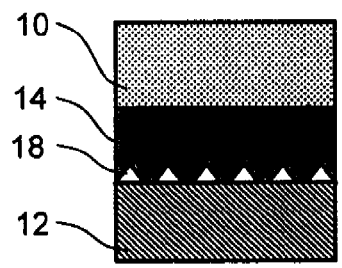
FIG. 9 is a schematic cross-sectional view showing an exemplary configuration of a switching element in Exemplary embodiment 2.

FIG. 9 is a schematic cross-sectional view showing an exemplary configuration of the switching element in this exemplary embodiment.

The switching element shown in FIG. 9 comprises first electrode 10, second electrode 12, and ion conductive layer 14, like Exemplary embodiment 1. Then, in this exemplary embodiment, oxygen absorption layer 18 is provided in an insular shape between second electrode 12 and ion conductive layer 14. In this regard, since the materials of first electrode 10, second electrode 12, ion conductive layer 14, and oxygen absorption layer 18 are similar to those in Exemplary embodiment 1, detailed descriptions are omitted.

Figure 10:
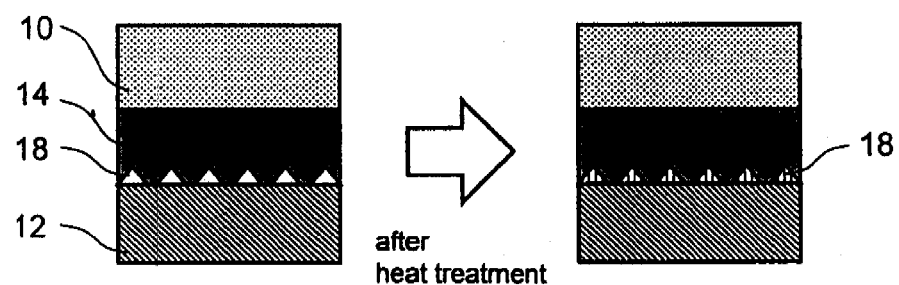
FIG. 10 is a schematic cross-sectional view showing how the switching element shown in FIG. 9 is like before and after a heat treatment.

FIG. 10 is a schematic cross-sectional view showing how the switching element of this exemplary embodiment is like before and after a heat treatment. As the switching element of this exemplary embodiment undergoes the heat treatment, oxygen which has conventionally binds with copper of second electrode 12 is trapped by oxygen absorption layer 18 formed in an insular shape. As a result, oxygen absorption layer 18 is oxidized to restrain second electrode 12 from oxidization.

Next, a description will be given of features of oxygen absorption layer 18 in this exemplary embodiment. In a deposition process for forming aluminum and tantalum, it is known that they grows in an insular shape in an initial stage of deposition, and then grow into a continuous film. For example, when aluminum is deposited in thickness of approximately 3 nm, aluminum does not grow into a continuous film but remains in an insular shape. By disposing oxygen absorption layer 18 on second electrode 12 in an insular shape, metal ions can be exchanged even though the ion conduction is inhibited, because ion conductive layer 14 is in contact with second electrode 12 in areas other than the island. In consideration of the oxygen absorption effect, it is better to provide a plurality of insular sites as in this exemplary embodiment.

When a material which does not exhibit the ion conductivity after it is oxidized (for example, aluminum) is used for the oxygen absorption layer, copper ions may not be sufficiently supplied from the second electrode after the oxidization. On the other hand, even when a material which exhibits the ion conductivity after it is oxidized (for example, tantalum) is used for the oxygen absorption layer, the ion conduction can be inhibited unless it is completely oxidized. In contrast, in this exemplary embodiment, since ion conductive film 14 is in contact with second electrode 12 in areas other than the islands, the ion conduction is smoothly performed in the event of switching.

Next, a description will be given of a method of manufacturing the switching element in this exemplary embodiment.

The method is similar to Exemplary embodiment 1 except that the oxygen absorption layer is made of aluminum in thickness of 3 nm in the process described in FIG. 8F. Insular aluminum can be provided by forming aluminum of 3 nm thick on the bottom and sides of connection hole 53 using a sputtering method. Also, in the heat treatment in the process described in FIG. 8H, aluminum absorbs oxygen and becomes aluminum oxide. While aluminum oxide is not the ion conductive layer, metal ions can be supplied from second electrode 58 to ion conductive layer 54 other than areas in which aluminum is formed.

Exemplary Embodiment 3

In a switching element in this exemplary embodiment, the oxygen absorption layer in Exemplary embodiment 1 is disposed at a position at which it is in contact with the second electrode but not in contact with the ion conductive layer. In the following, the configuration of this exemplary embodiment will be described.

Figure 11:
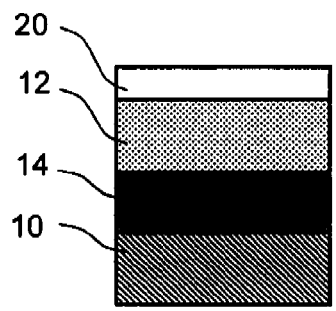
FIG. 11 is a schematic cross-sectional view showing an exemplary configuration of a switching element in Exemplary embodiment 3.

FIG. 11 is a schematic cross-sectional view showing an exemplary configuration of the switching element in this exemplary embodiment.

The switching element shown in FIG. 11 comprises first electrode 10, second electrode 12, and ion conductive layer 14, like Exemplary embodiment 1. Then, in this exemplary embodiment, oxygen absorption layer 20 is provided on second electrode 12. In this regard, since the materials of first electrode 10, second electrode 12, ion conductive layer 14, and oxygen absorption layer 20 are similar to those in Exemplary embodiment 1, detailed descriptions are omitted.

Figure 12:
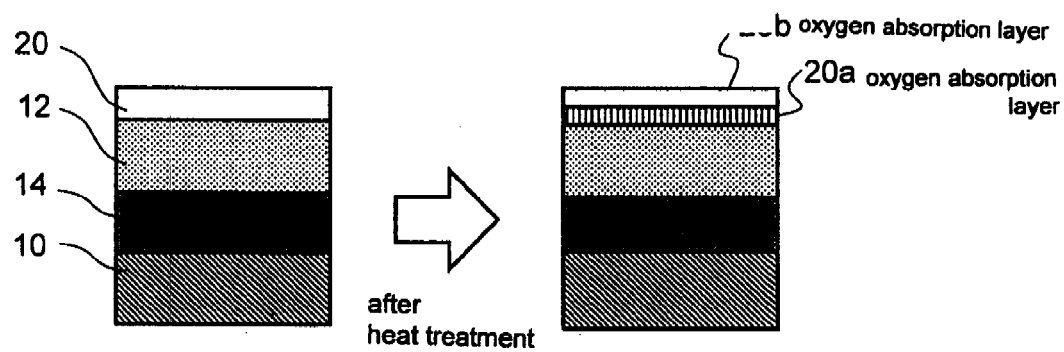
FIG. 12 is a schematic cross-sectional view showing how the switching element shown in FIG. 11 is like before and after a heat treatment.

FIG. 12 is a schematic cross-sectional view showing how the switching element of this exemplary embodiment is like before and after a heat treatment. As the switching element of this exemplary embodiment undergoes the heat treatment, oxygen which has conventionally binds with copper of second electrode 12 is trapped by oxygen absorption layer 20. As a result, oxygen absorption layer 20a is oxidized to restrain second electrode 12 from oxidization. FIG. 12 shows that oxygen absorption layer 20 has a large thickness, where oxygen absorption layer 20a in contact with second electrode 12 is oxidized, while oxygen absorption layer 20b opposite to second electrode 12 is not oxidized.

Next, a description will be given of differences with the aforementioned exemplary embodiments. In Exemplary embodiment 1 and Exemplary embodiment 3, since the oxygen absorption layer is provided between ion conductive layer 14 and second electrode 12, the oxygen absorption layer affects the supply of metal ions from second electrode 12. On the other hand, when oxygen absorption layer 20 is provided at a location other than between ion conductive layer 14 and second electrode 12 as in this exemplary embodiment, it will not affect the supply of metal ions. However, since oxygen generated from ion conductive layer 14 must migrate into second electrode 12, the yield rate of oxygen is inferior to Exemplary embodiment 1 and Exemplary embodiment 2. On the other hand, it has been confirmed that oxygen migrates into second electrode 12 during heating at 350° C. or higher, and oxygen absorption layer 20 provided on the surface of second electrode 12 opposite to ion conductive layer 14 sufficiently functions. In the following, a description will be given of an experiment in which the effect was confirmed.

In the experiment, as a sample of the structure of this exemplary embodiment, a switching element was fabricated, where tantalum oxide (20 nm thick) was used for ion conductive layer 14; copper (100 nm thick) was used for second electrode 12; platinum (100 nm thick) was used for first electrode 10; aluminum of 5 nm thick was used for oxygen absorption layer 20. Also, for comparing particulars, a switching element not provided with oxygen absorption layer 20 was also prepared as a sample of the conventional structure. After fabricating the respective devices, they underwent an anneal treatment at 400° C. It had been confirmed that both devices operated before the anneal.

Figure 13A:
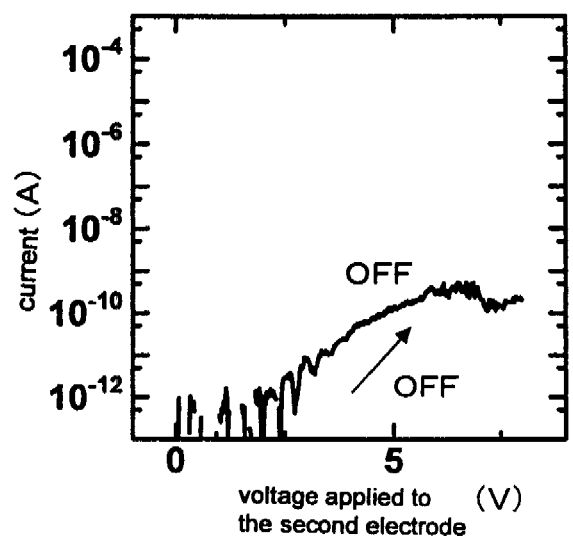
FIG. 13A is a graph showing the effect of an oxygen absorption layer in Exemplary embodiment 3.
Figure 13B:
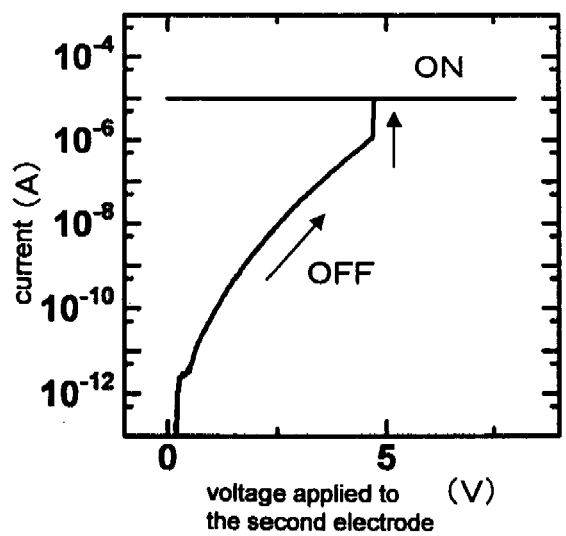
FIG. 13B is another graph showing the effect of the oxygen absorption layer in Exemplary embodiment 3.

FIGS. 13A and 13B are graphs showing characteristic results of the switching elements. FIG. 13A shows the case of the switching element in the conventional structure, and FIG. 13B shows the case of the switching element in the structure of this exemplary embodiment. Also, the vertical axis of the graphs represents a current flowing between the electrodes, and the horizontal axis represents a voltage applied to the second electrode.

As shown in FIG. 13A, when oxygen absorption layer 20 was not provided, the switching element did not transition to an ON state even if the second electrode was applied with a voltage up to 8 V. On the other hand, when aluminum was provided as oxygen absorption layer 20, the switching element transitioned to the ON state as the second electrode was applied with a voltage, in a manner similar to before the anneal, as shown in FIG. 13B. From this fact, it was confirmed that in the switching element of this exemplary embodiment, aluminum trapped oxygen diffusing into copper to effectively restrain copper from oxidization.

In Exemplary embodiment 1, when a material which does not exhibit the ion conductivity after it is oxidized (for example, aluminum) is used for the oxygen absorption layer, copper ions may not be sufficiently supplied from the second electrode after the oxidization. On the other hand, even when a material which exhibits the ion conductivity after it is oxidized (for example, tantalum) is used for the oxygen absorption layer, the ion conduction can be inhibited unless it is completely oxidized. In contrast, in this exemplary embodiment, since oxygen absorption layer 20 is provided at a location in contact with second electrode 12 but not in contact with ion conductive layer 14, the ion conduction is smoothly performed in the event of switching.

Figure 14A:
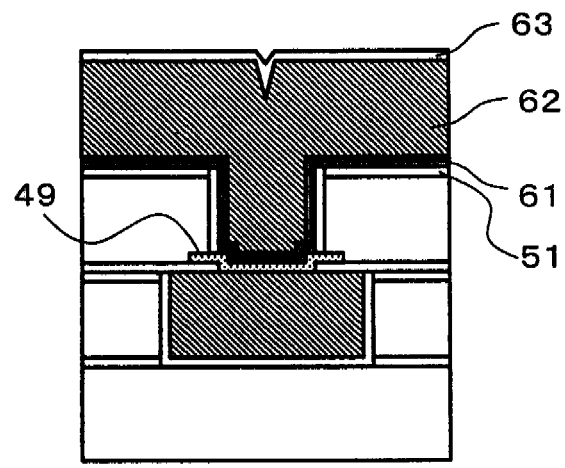
FIG. 14A is a schematic cross-sectional view for describing a method for manufacturing the switching element in Exemplary embodiment 3.
Figure 14B:
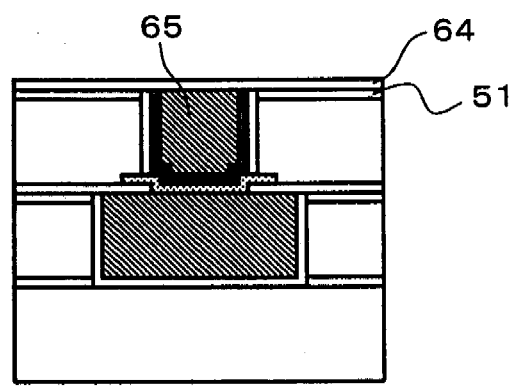
FIG. 14B is a schematic cross-sectional view for describing a method for manufacturing the switching element in Exemplary embodiment 3.

Next, a description will be given of a method of manufacturing the switching element in this exemplary embodiment. Processes shown in FIGS. 14A to 14B are executed after the processes shown in FIGS. 8A to 8E. Accordingly, here, detailed descriptions on the processes shown in FIGS. 8A to 8E are omitted, and processes subsequent thereto will be described.

After the processes shown in FIGS. 8A to 8E described in Exemplary embodiment 1, ion conductive layer 61 is deposited on the bottom and sides of connection hole 53 and on second stop insulating film 51 by a sputtering method. Tantalum oxide of 15 nm thick is used for ion conductive layer 61. Next, a copper seed layer (not shown) containing aluminum is formed on ion conductive layer 61 by a CVD method. The thickness of the copper seed layer is set to approximately 5 to 50 nm. Then, copper 62 is formed on the copper seed layer by a plating method. The thickness of copper is set to approximately 300 to 800 nm. Subsequently, oxygen absorption layer 63 is formed on copper 62 by a sputtering method (FIG. 14A). Aluminum of 5 nm thick is used for oxygen absorption layer 63.

Subsequently, heating is performed at 350° C. in a nitrogen gas atmosphere. In this anneal process, crystal grains of copper increases, and aluminum contained in the copper seed diffuses into copper 62, playing a role of increasing electromigration durability. In this heat treatment, oxygen within ion conductive layer 61 diffuses into copper 62 to oxidize part of oxygen absorption layer 63.

Next, as shown in FIG. 14B, unnecessary oxygen absorption layer 63, ion conductive layer 61, and copper 62 on second stop insulating film 51, other than connection hole 52, are scraped off by an approach such as a CMP method, followed by formation of third protection insulating film 64 on second stop insulating film 51. Since a wiring process subsequent thereto is similar to the conventional art, a description thereon is omitted.

A description will be given of the correspondence of components of the switching element shown in FIG. 11 to the layers shown in FIGS. 14A to 14B.

Second electrode 65 shown in FIG. 11h corresponds to second electrode 12 in FIG. 11. Then, first electrode 49 shown in FIGS. 8C to 8H corresponds to first electrode 10 in FIG. 11.

By the heat treatment required in each process from the process described in FIG. 5 to the full completion of the semiconductor integrated circuit manufacturing processes, oxygen within ion conductive layer 54 and inter-layer dielectric film diffuses into aluminum in oxygen absorption layer 63, so that aluminum is oxidized.

Exemplary Embodiment 4

This exemplary embodiment applies the present invention to a three-terminal switching element.

Figure 15:
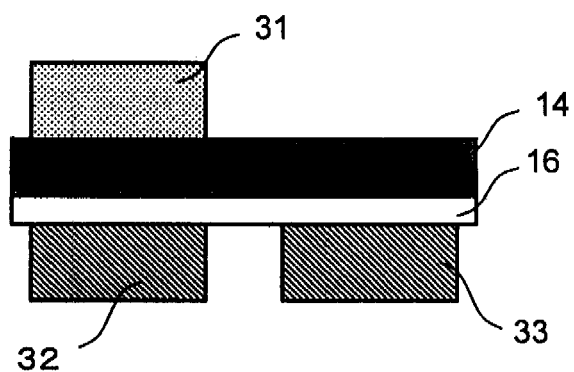
FIG. 15 is a schematic cross-sectional view showing an exemplary configuration of a switching element in Exemplary embodiment 4.

FIG. 15 is a schematic cross-sectional view showing an exemplary configuration of a switching element in this exemplary embodiment.

As shown in FIG. 15, the switching element of this exemplary embodiment comprises third electrode 33 for controlling the resistance between electrodes other than first electrode 31 and second electrode 32, the resistance of which changes between an ON state and an OFF state. Oxygen absorption layer 16 is provided on second electrode 32 and third electrode 33, and ion conductive layer 14 is provided on oxygen absorption layer 16. Second electrode 32 and third electrode 33 are formed on the same plane on the bottom side of ion conductive layer 14. Second electrode 32 and third electrode 33 are formed with a spacing of approximately 10 to 100 nm therebetween.

The material of second electrode 32 and third electrode 33 are copper, while the material of ion conductive layer 14 is tantalum oxide. The material of first electrode 31 is tantalum.

In the three-terminal switch of this exemplary embodiment, oxygen absorption layer 16 is also oxidized when it undergoes a heat treatment, to prevent second electrode 32 and third electrode 33 from oxidization. As a result, similar effects to those of Exemplary embodiment 1 are produced. Also, when this exemplary embodiment is applied to Exemplary embodiment 2, similar effects to those of this exemplary embodiment are produced.

Next, a description will be given of a method of manufacturing the switching element in this exemplary embodiment. FIGS. 16A to 16G are schematic cross-sectional views for describing the method of manufacturing the switching element in this exemplary embodiment.

Figure 16A:
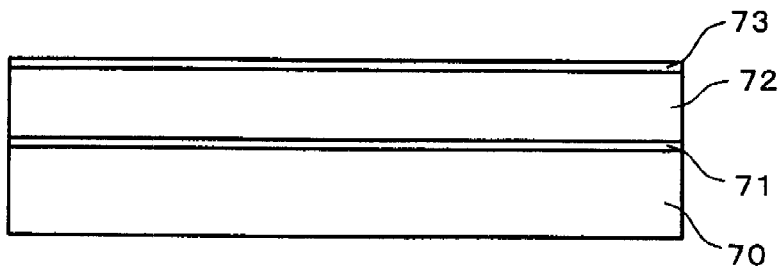
FIG. 16A is a schematic cross-sectional view for describing a method for manufacturing the switching element in Exemplary embodiment 4.
Figure 16B:
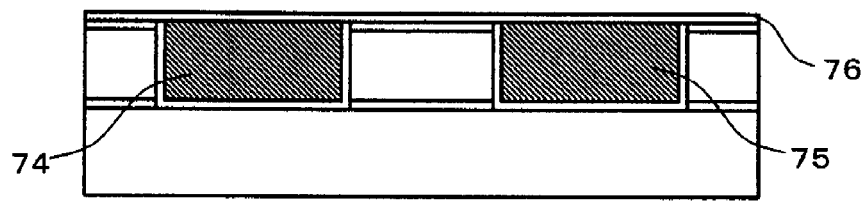
FIG. 16B is a schematic cross-sectional view for describing a method for manufacturing the switching element in Exemplary embodiment 4.

Through a process similar to FIG. 8A described in Exemplary embodiment 1, first passivation film 71, first inter-layer dielectric film 72, and first stop insulating film 73 are formed in order on substrate 70 (FIG. 16A). In this regard, like substrate 40 in Exemplary embodiment 1, semiconductor devices including transistors are formed on a semiconductor substrate using conventional technologies, and an insulating film is formed on the semiconductor device, resulting in substrate 70. Subsequently, second electrode 74 and third electrode 75 are formed in a manner similar to the method of forming copper wire 46 in FIG. 8B, and second protection insulating film 76 is formed thereon (FIG. 16B).

Figure 16C:
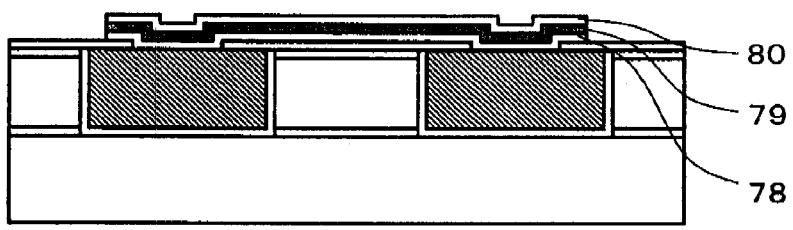
FIG. 16C is a schematic cross-sectional view for describing a method for manufacturing the switching element in Exemplary embodiment 4.
Figure 16D:
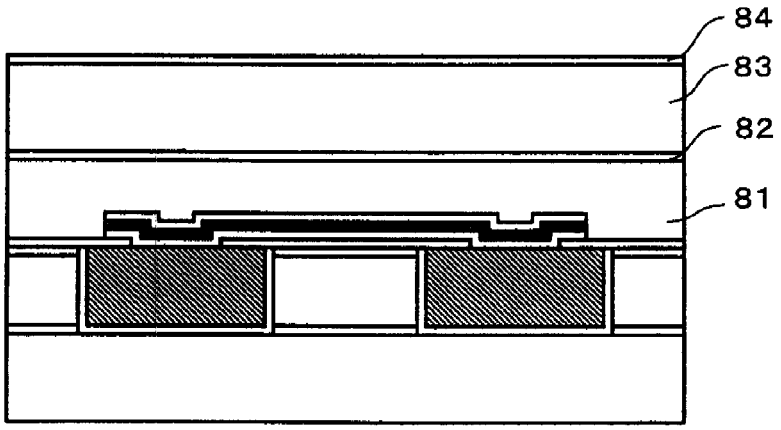
FIG. 16D is a schematic cross-sectional view for describing a method for manufacturing the switching element in Exemplary embodiment 4.

Next, part of second protection insulating film 76 on second electrode 74 and third electrode 75 is removed by etching. Then, oxygen absorption layer 78, ion conductive layer 79, and protection insulating film 80 are deposited by a sputtering method, and a desired pattern is formed by etching (FIG. 16C). Then, as shown in FIG. 16D, second inter-layer dielectric film 81, third protection insulating film 82, third inter-layer dielectric film 83, and second stop insulating film 84 are formed in order on an exposed surface of second protection insulating film 76 and protection insulating film 80.

Figure 16E:
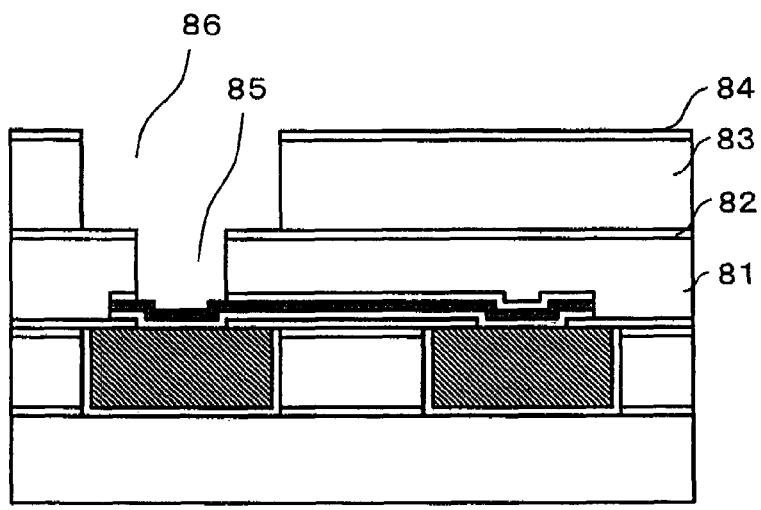
FIG. 16E is a schematic cross-sectional view for describing a method for manufacturing the switching element in Exemplary embodiment 4.

Next, connection hole 85 and wire groove 86 are formed in second inter-layer dielectric film 81, third protection insulating film 82, third inter-layer dielectric film 83, and second stop insulating film 84 by a lithography technology and etching. Then, protection insulating film 80 on the bottom of connection hole 85 is removed by etching (FIG. 16E).

Figure 16F:
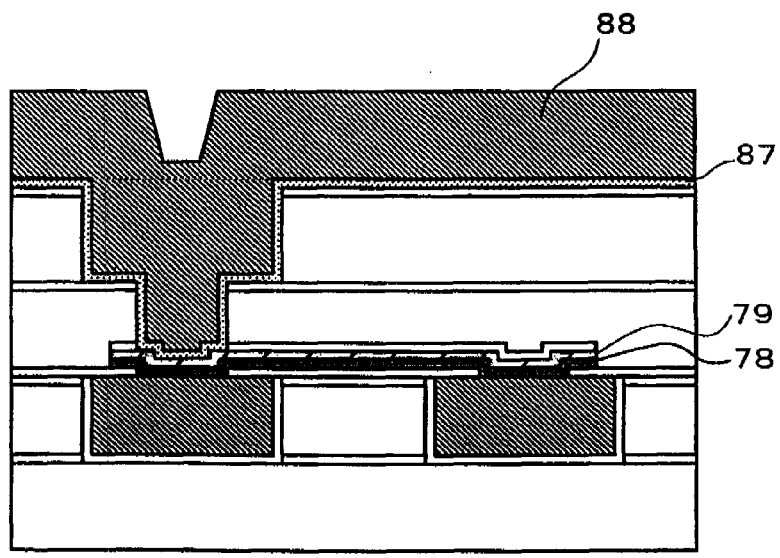
FIG. 16F is a schematic cross-sectional view for describing a method for manufacturing the switching element in Exemplary embodiment 4.

Next, barrier metal 87 is deposited on the bottom and sides of connection hole 85 and on sides of wire groove 86 by a sputtering method. Subsequently, a copper seed layer (not shown) containing aluminum is formed on barrier metal 87 by a CVD method. The thickness of the copper seed layer is set to approximately 5 to 50 nm. Further, copper 88 is formed on the copper seed layer by a plating method. The thickness of copper is set to approximately 300 to 800 nm. Subsequently, heating is performed at 350° C. in a nitrogen gas atmosphere. In this anneal process, crystal grains of copper increases, and aluminum contained in the copper seed diffuses into copper, playing a role of increasing electro-migration durability. In this heat treatment, oxygen within ion conductive layer 79 diffuses to oxidize oxygen absorption layer 78 (FIG. 16F).

Figure 16G:
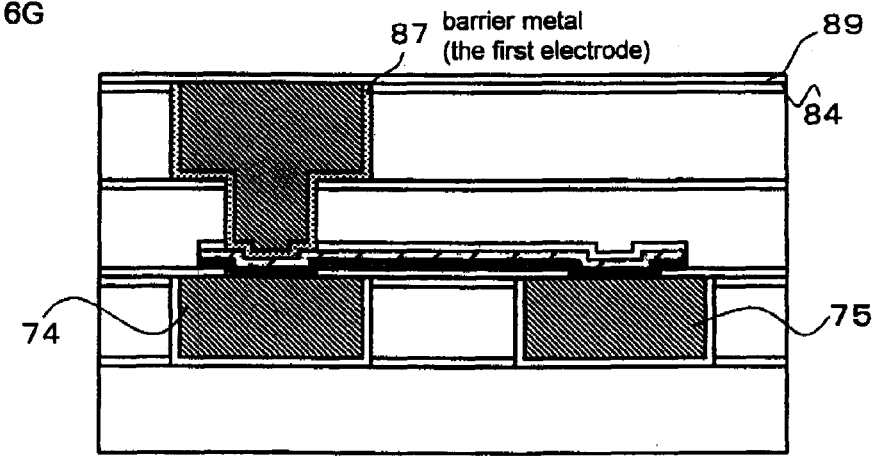
FIG. 16G is a schematic cross-sectional view for describing a method for manufacturing the switching element in Exemplary embodiment 4.

Next, as shown in FIG. 16G, unnecessary barrier metal 87 and copper 88 on second stop insulating film 84 are scraped off by an approach such as a CMP method, followed by formation of fourth protection insulating film 89 on second stop insulating film 84. Since a wiring process subsequent thereto is similar to the conventional art, a description thereon is omitted.

A description will be given of the correspondence of components of the switching element shown in FIG. 15 to the layers shown in FIGS. 16A to 16G. Second electrode 74 shown in FIGS. 16B to 16G corresponds to second electrode 32 in FIG. 15; barrier metal 87 to first electrode 31 in FIG. 15; and third electrode 75 to third electrode 33 in FIG. 15, respectively.

By the heat treatment required in each process from the process described in FIG. 16C to the full completion of the semiconductor integrated circuit manufacturing processes, oxygen within ion conductive layer 79 and inter-layer dielectric film diffuses into tantalum in oxygen absorption layer 78, so that tantalum is oxidized. As tantalum in oxygen absorption layer 78 is oxidized, it is homogenized with tantalum oxide of ion conductive layer 79, as shown in FIG. 16F, and functions as an ion conductive layer of the switching element. On the other hand, when tantalum is used as the first electrode, even part thereof oxidized would be homogenized with the ion conductive layer.

In regard to the method of manufacturing the switching element in Exemplary embodiment 1 to Exemplary embodiment 4, a material which restrains copper from diffusing into an oxide film, for example, silicon nitride or a material which contains an arbitrary amount of carbon mixed therein, or the like are preferable for first protection insulating films 41, 71, second protection insulating films 47, 76, third protection insulating films 57, 64, 82, fourth protection insulating film 89, protection insulating film 80, and barrier insulating film 52.

Also, a low-dielectric insulating film preferable for first inter-layer dielectric films 42, 72, second inter-layer dielectric films 50, 81, and third inter-layer dielectric film 83, is a compound of silicon and oxygen, to which arbitrary amounts of hydrogen, fluorine, and carbon are added, and which has a dielectric constant lower than a silicon oxide film. It is known that a film including voids further reduces the dielectric constant. The low-dielectric insulating film may be structured to have voids. The size of the voids is preferably 2 nm or less.

Also, when first stop insulating films 43, 73 and second stop insulating films 51, 84 are made of silicon oxide films, their thicknesses may be approximately 50 to 200 nm. The respective insulating films can be formed by a sputtering method or a CVD method which are conventional technologies.

Also, tantalum of approximately 30 nm thick can be used for barrier metals 45, 87. Alternatively, a laminate structure of tantalum nitride and tantalum may be used with respective thicknesses which may be approximately 5 to 30 nm.

As described in the foregoing Exemplary embodiment 1 to Exemplary embodiment 4, the present invention can prevent the electrodes of the switching element from being oxidized under a high-temperature environment during semiconductor integrated circuit manufacturing processes, and prevent degradation in function of a switch which changes the resistance.

It should also be understood that the present invention is not limited to the exemplary embodiments described above, and a variety of modifications can be made within the scope of the invention and they are also included in the scope of the invention as well.

The invention claimed is:

1. A switching element comprising:
   an ion conductive layer capable of conducting a metal ion;
   a first electrode arranged in contact with said ion conductive layer;
   a second electrode for supplying said metal ion to said ion conductive layer, said switching element utilizing an electro-chemical reaction to operate; and
   an oxygen absorption layer, including a material more prone to oxidization than said second electrode, is arranged in contact with said second electrode;
   wherein said material of said oxygen absorption layer is tantalum and a thickness of said oxygen absorption layer is less than 2 nm,
   wherein said oxygen absorption layer is arranged between said second electrode and said ion conductive layer; and
   said oxygen absorption layer, when oxidized, has an ion conductive property with said metal ion serving as a carrier.

2. A switching element comprising:
   an ion conductive layer capable of conducting a metal ion;
   a first electrode arranged in contact with said ion conductive layer;
   a second electrode which exhibits a change in electric characteristics with said first electrode due to deposition or dissolution of said metal ion;
   a third electrode for supplying said metal ion to said ion conductive layer, said switching element utilizing an electro-chemical reaction to operate; and
   an oxygen absorption layer, including a material more prone to oxidization than said third electrode, is arranged in contact with said third electrode;
   wherein said material of said oxygen absorption layer is tantalum and a thickness of said oxygen absorption layer is less than 2 nm,
   wherein said oxygen absorption layer is arranged between said third electrode and said ion conductive layer; and
   said oxygen absorption layer, when oxidized, has an ion conductive property said metal ion serving as a carrier.

3. The switching element according to claim 1, wherein said ion conductive layer includes tantalum oxide.

4. The switching element according to claim 2, wherein said ion conductive layer includes tantalum oxide.

5. The switching element according to claim 1, wherein said oxygen absorption layer is arranged in an insular shape between said second electrode and said ion conductive layer.

6. The switching element according to claim 2, wherein said oxygen absorption layer is arranged in an insular shape between said third electrode and said ion conductive layer.

7. The switching element according to claim 1, wherein a material of said second electrode is copper, and said first electrode is made of a material which is less prone to become a metal ion as compared with copper.

8. The switching element according to claim 2, wherein a material of said third electrode is copper, and said first electrode and said second electrode are made of a material which is less prone to become a metal ion as compared with copper.

* * * * *